United States Patent

Masenas

[19]

[11] Patent Number: 5,771,011
[45] Date of Patent: Jun. 23, 1998

[54] MATCH DETECT LOGIC FOR MULTI-BYTE PER CYCLE HARDWARE DATA COMPRESSION

[75] Inventor: Charles J. Masenas, Essex Junction, Vt.

[73] Assignee: International Business Machines Corporation, Armonk, N.Y.

[21] Appl. No.: 680,738

[22] Filed: Jul. 15, 1996

[51] Int. Cl.[6] .................................................. H03M 7/30
[52] U.S. Cl. ............................................... 341/51; 341/50
[58] Field of Search ......................................... 341/51, 50

[56] References Cited

U.S. PATENT DOCUMENTS

| 4,672,539 | 6/1987 | Goertzel | 364/300 |
|---|---|---|---|
| 4,847,619 | 7/1989 | Kato et al. | 341/106 |
| 4,933,847 | 6/1990 | Chau et al. | 364/200 |
| 5,142,282 | 8/1992 | Tobin et al. | 341/55 |
| 5,151,697 | 9/1992 | Bunton | 341/51 |
| 5,197,140 | 3/1993 | Balmer | 395/400 |
| 5,257,237 | 10/1993 | Aranda et al. | 365/230.05 |
| 5,323,155 | 6/1994 | Iyer et al. | 341/51 |
| 5,357,546 | 10/1994 | Meriwether et al. | 375/122 |
| 5,384,567 | 1/1995 | Hassner et al. | 341/51 |
| 5,410,671 | 4/1995 | Elgamal et al. | 395/425 |
| 5,412,384 | 5/1995 | Chang et al. | 341/79 |
| 5,424,732 | 6/1995 | Iyer et al. | 341/51 |
| 5,440,753 | 8/1995 | Hou et al. | 395/800 |
| 5,525,982 | 6/1996 | Cheng et al. | 341/51 |

FOREIGN PATENT DOCUMENTS

| 546863 A2 | 6/1993 | European Pat. Off. . |
|---|---|---|
| 633668 A2 | 1/1995 | European Pat. Off. . |
| 660531 A2 | 6/1995 | European Pat. Off. . |
| 677927 A2 | 10/1995 | European Pat. Off. . |

OTHER PUBLICATIONS

"Data Compression for Displaywriter's Display of PC Data"; IBM TDB, vol. 28, No. 5, Oct. 1985; J. W. Fountain, pp. 2144–2146.

"Space Compression Using Multiple Space Character Sizes"; IBM TDB, vol. 26, No. 9, Feb. 1984; C.J. Lovell and V.A. Mayfield.

"Multi Byte Dataflow Techniques With Single Byte Controls"; IBM TDB, vol. 37, No. 04A, Apr. 1994; A.L. Bergey and R.J. Chapman; pp. 167–173.

"Method for Incorporating Data Conversion Into Text Compression Scheme"; IBM TDB, vol. 36, No. 09B, Sep. 1993; T.D. Gree et al.; pp. 313–314.

"Algorithm to Identify Common Phrases in Source Text"; IBM TDB, vol. 33, No. 12, May 1991; G.D. Timms, Jr.; pp. 150–152.

*Primary Examiner*—Jeffrey A. Gaffin
*Assistant Examiner*—Peguy JeanPierre
*Attorney, Agent, or Firm*—Whitham, Curtis, Whitham & McGinn; Robert A. Walsh

[57] ABSTRACT

A multi-byte per cycle string matching apparatus for compression of text files compares an input stream, at least two bytes per cycle, against cells of a history buffer and detects all match state trajectories indicative of a string, generates a corresponding signal, prioritizes among multiple concurrent strings and outputs a string termination signal based on that priority.

8 Claims, 7 Drawing Sheets

$$ML = \begin{bmatrix}
0 & 0 & 1 & 0 & 1 & 0 & 1 & 0 & 0 & 0 & 1 & 0 & 0 & 1 & 1 & 0 & 0 & 0 & 1 & 1 & 1 & 1 & 1 & 0 & 0 & 1 & 1 & 1 & 0 & 1 & 0 & 1 \\
0 & 0 & 1 & 1 & 0 & 1 & 0 & 1 & 1 & 0 & 1 & 0 & 0 & 1 & 1 & 0 & 0 & 0 & 0 & 1 & 0 & 1 & 0 & 1 & 0 & 1 & 0 & 1 & 0 & 1 & 1 \\
0 & 0 & 0 & 1 & 1 & 0 & 1 & 0 & 1 & 0 & 0 & 1 & 1 & 0 & 1 & 1 & 1 & 0 & 1 & 0 & 0 & 0 & 0 & 1 & 1 & 0 & 0 & 1 & 0 & 1 & 0 \\
0 & 0 & 0 & 0 & 0 & 1 & 1 & 1 & 1 & 0 & 0 & 0 & 0 & 0 & 1 & 1 & 0 & 0 & 1 & 0 & 1 & 1 & 1 & 1 & 0 & 1 & 0 & 0 & 1 & 0 & 1 & 1 \\
0 & 0 & 0 & 0 & 0 & 0 & 0 & 1 & 0 & 0 & 1 & 0 & 0 & 0 & 0 & 1 & 1 & 1 & 0 & 0 & 1 & 1 & 0 & 1 & 0 & 0 & 1 & 0 & 0 & 0 & 1 \\
0 & 0 & 0 & 0 & 0 & 0 & 1 & 1 & 0 & 1 & 0 & 0 & 0 & 1 & 1 & 0 & 1 & 0 & 0 & 0 & 0 & 1 & 1 & 1 & 0 & 0 & 0 & 0 & 1 & 1 \\
0 & 0 & 0 & 0 & 0 & 0 & 0 & 1 & 0 & 1 & 0 & 1 & 0 & 0 & 0 & 0 & 1 & 1 & 1 & 0 & 0 & 0 & 1 & 1 & 0 & 0 & 1 & 1 & 0 & 0 \\
0 & 0 & 0 & 0 & 0 & 0 & 0 & 0 & 1 & 0 & 1 & 0 & 1 & 0 & 0 & 0 & 0 & 1 & 1 & 0 & 0 & 1 & 0 & 0 & 0 & 0 & 0 & 0 & 0 & 0
\end{bmatrix}$$

$$PS = \begin{bmatrix}
0 & 0 & 0 & 1 & 0 & 0 & 0 & 1 & 0 & 0 & 0 & 1 & 0 & 0 & 1 & 0 & 0 & 0 & 0 & 1 & 0 & 1 & 0 & 1 & 0 & 0 & 0 & 1 & 1 & 0 & 1 & 1 \\
0 & 0 & 0 & 1 & 1 & 0 & 0 & 0 & 1 & 1 & 0 & 1 & 0 & 0 & 1 & 1 & 0 & 0 & 0 & 0 & 0 & 1 & 0 & 0 & 0 & 0 & 0 & 1 & 0 & 1 & 0 & 1 \\
0 & 0 & 0 & 0 & 0 & 1 & 0 & 0 & 0 & 0 & 1 & 0 & 0 & 0 & 1 & 0 & 1 & 1 & 1 & 0 & 0 & 0 & 0 & 0 & 0 & 0 & 0 & 0 & 0 & 0 & 0 \\
0 & 0 & 0 & 0 & 0 & 0 & 1 & 1 & 0 & 1 & 0 & 0 & 0 & 0 & 0 & 1 & 0 & 0 & 0 & 1 & 0 & 1 & 0 & 0 & 1 & 0 & 0 & 0 & 0 & 0 & 0 \\
0 & 0 & 0 & 0 & 0 & 0 & 0 & 0 & 1 & 0 & 0 & 1 & 0 & 0 & 0 & 0 & 1 & 1 & 0 & 0 & 0 & 1 & 0 & 0 & 1 & 0 & 0 & 1 & 0 & 0 & 0 \\
0 & 0 & 0 & 0 & 0 & 0 & 0 & 0 & 1 & 0 & 0 & 1 & 0 & 0 & 0 & 0 & 1 & 0 & 1 & 0 & 0 & 0 & 0 & 1 & 0 & 1 & 0 & 0 & 0 & 0 & 0 \\
0 & 0 & 0 & 0 & 0 & 0 & 0 & 0 & 0 & 1 & 0 & 1 & 0 & 1 & 0 & 0 & 0 & 0 & 0 & 0 & 1 & 1 & 0 & 0 & 0 & 1 & 0 & 0 & 0 & 0 & 1 & 0 \\
0 & 0 & 0 & 0 & 0 & 0 & 0 & 0 & 0 & 1 & 0 & 1 & 0 & 0 & 0 & 0 & 0 & 0 & 1 & 0 & 0 & 0 & 1 & 0 & 0 & 0 & 0 & 0 & 0 & 0 & 1 & 0
\end{bmatrix}$$

$$M = \begin{bmatrix}
0 & 0 & 0 & 0 & 0 & 0 & 0 & 0 & 0 & 0 & 0 & 0 & 0 & 0 & 0 & 0 & 0 & 1 & 0 & 0 & 0 & 1 & 0 & 0 & 0 & 0 & 0 & 0 & 0 & 0 \\
0 & 0 & 0 & 1 & 0 & 0 & 0 & 1 & 0 & 0 & 0 & 0 & 0 & 0 & 0 & 1 & 0 & 0 & 0 & 0 & 0 & 0 & 0 & 0 & 0 & 0 & 0 & 0 & 1 & 0 & 1 & 0 \\
0 & 0 & 0 & 1 & 0 & 0 & 0 & 1 & 0 & 0 & 0 & 0 & 0 & 0 & 1 & 0 & 0 & 0 & 0 & 0 & 0 & 0 & 0 & 0 & 0 & 0 & 0 & 0 & 0 & 0 \\
0 & 0 & 0 & 0 & 0 & 1 & 0 & 0 & 0 & 0 & 0 & 0 & 0 & 1 & 0 & 0 & 0 & 1 & 0 & 0 & 0 & 0 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 0 & 0 & 0 & 1 & 0 & 0 & 1 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 1 & 0 & 0 & 0 & 0 & 0 \\
0 & 0 & 0 & 0 & 0 & 0 & 0 & 0 & 0 & 0 & 1 & 0 & 0 & 0 & 0 & 0 & 0 & 1 & 0 & 0 & 0 & 1 & 0 & 0 & 0 & 0 & 0 & 0 & 0 & 0 \\
0 & 0 & 0 & 0 & 0 & 0 & 0 & 0 & 0 & 0 & 0 & 0 & 0 & 0 & 0 & 0 & 0 & 0 & 0 & 1 & 0 & 0 & 0 & 0 & 0 & 0 & 0 & 0 & 0 & 0
\end{bmatrix}$$

$ORM = (0\ 0\ 0\ 1\ 1\ 1\ 0\ 1\ 0\ 1\ 0\ 0\ 1\ 0\ 1\ 1\ 0\ 0\ 1\ 1\ 0\ 1\ 1\ 0\ 1\ 1\ 0\ 0\ 1\ 0\ 1\ 0)$

FIG.3
PRIOR ART

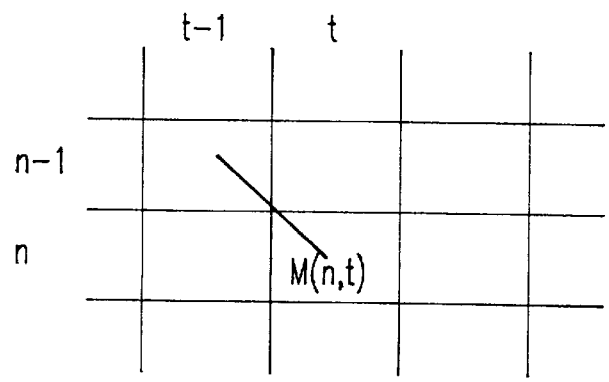

$$PS = \begin{bmatrix} 0 & 0 & 0 & 0 & 0 & 0 & 1 & 0 & 0 & 0 & 0 & 0 & 1 & 1 \\ 0 & 0 & 1 & 0 & 1 & 0 & 0 & 1 & 0 & 0 & 0 & 0 & 0 & 0 \\ 0 & 0 & 0 & 0 & 0 & 1 & 0 & 1 & 1 & 1 & 0 & 0 & 0 & 0 \\ 0 & 0 & 0 & 1 & 0 & 0 & 0 & 0 & 0 & 0 & 0 & 1 & 0 & 0 \\ 0 & 0 & 0 & 0 & 0 & 0 & 1 & 0 & 0 & 1 & 0 & 1 & 0 & 0 \\ 0 & 0 & 0 & 0 & 0 & 1 & 0 & 0 & 0 & 0 & 0 & 1 & 1 & 0 & 0 \\ 0 & 0 & 0 & 0 & 0 & 0 & 0 & 0 & 0 & 1 & 0 & 0 & 0 & 1 \\ 0 & 0 & 0 & 0 & 0 & 0 & 0 & 0 & 1 & 0 & 1 & 0 & 0 & 0 & 1 \end{bmatrix}$$

$$M = \begin{bmatrix} 0 & 0 & 0 & 0 & 0 & 0 & 0 & 0 & 0 & 1 & 0 & 0 & 0 & 0 \\ 0 & 1 & 0 & 1 & 0 & 0 & 0 & 0 & 0 & 0 & 0 & 0 & 1 & 1 \\ 0 & 0 & 0 & 0 & 1 & 0 & 0 & 1 & 0 & 0 & 0 & 0 & 0 & 0 \\ 0 & 0 & 1 & 0 & 0 & 0 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 1 & 0 & 0 & 0 & 0 \\ 0 & 0 & 0 & 0 & 0 & 1 & 0 & 0 & 1 & 0 & 0 & 0 & 0 & 0 \\ 0 & 0 & 0 & 0 & 0 & 0 & 0 & 0 & 1 & 0 & 0 & 0 & 0 & 0 \end{bmatrix}$$

```
ML(n,t):
                Time, t
          0  1  2  3  4  5  6  7  8  9  10 11
          0  1  0  1  0  1  0  1  0  1  0  1  0  1  0  1
     n 0  X           X X           X X
       1  X X         X X           X X
       2  X X X             X X           X X
       3  X X X X           X X           X X
       4  X X X X X               X X           X X
       5  X X X X X X             X X           X X
       6  X X X X X X X                 X X           X X
       7  X X X X X X X X               X X           X X
```

FIG. 13

MATCH DETECT LOGIC FOR MULTI-BYTE PER CYCLE HARDWARE DATA COMPRESSION

BACKGROUND OF THE INVENTION

1. Field of the Invention

The present invention relates generally to dictionary-based compression methods and, more particularly, to the compression of a file string by matching the string against a dictionary, and parsing according to detected matches, and outputting a new data representing, in a reversible manner, the original string as a succession of matches with the dictionary.

2. Background Description

Compression is the coding of data to minimize the number of bits needed to represent an underlying "raw" data file or information. The raw data file can, for example, be the text of a book, with each alphanumeric character of the text being one byte of digital data. Without compression, all subsequent processing, storage and transmission of the file requires eight bits per text character, and becomes quite large when, for example, the file consists of entire text of a book. This uncompressed representation is inefficient because text files almost always contain multiple occurrences of a character string within words, and/or multiple occurrences of the same word and phrases. For example, the words "the," "there," "their" and "therefore" all contain the three character string of "t,h,e." Assuming eight bits per character, 24 bits are required for each occurrence of this three bit sequence. If that particular three bit sequence, however, were translated into a new word having less than 24 bits, the number of bits to represent the underlying text would be fewer.

An uncompressed raw data representation of course does not exploit this redundancy and instead represents, and hence stores and transfers, each repeated occurrence with all of its constituent characters.

"Dictionary-based encoding" is a compression method which partially removes this redundancy, and thus obtains compression, by replacing repeated strings of consecutive characters, or repeated words or phrases, with indices into a dictionary. Dictionary encoding can use either a static or dynamic dictionary. A static dictionary is preset and does not change according to the input data or text. A dynamic dictionary is updated depending on the input data.

Referring first to a static dictionary, the means by which compression is achieved is readily described. A set of words or phrases $W(i)$, $i=1,N$ each having a length of $L(i)$ number of characters is stored in a dictionary. Input data is compared, on a byte-by-byte or word-by-word basis, against each entry of the dictionary. The term "word-by-word" is conceptual and does not mean one word per machine cycle. When a match is found at, for example, the Bth location, the raw data string is replaced by a pointer to that Bth location. If no match is found, the raw data is output. The output datum points have a flag indicating whether the datum is a pointer or is raw data. Compression is achieved because each time a raw data string is replaced by a pointer there are fewer bits in the pointer than were in the represented the raw data.

Static dictionary methods, however, must pre-store a set of words or character strings which, on average, have a high repetition rate within general text. The dictionary cannot be optimized, however, based on repetition of characters or words within a particular text. Further, if a dictionary is made so large as to encompass all likely string sequences, the pointer to the string location, assuming enough bits to address all locations in the dictionary, will become so large that it may defeat the compression objective.

Accordingly, "dynamic" or "adaptive" dictionary encoding methods, which establish and/or update the dictionary according to the input text are preferable for many applications.

There is a plurality of known dynamic dictionary encoding methods. One is the Ziv-Lempel LZ1977 method, which is well known in the art and is described, for example, in "A Universal Algorithm for Sequential Data Compression," IEEE Trans. Information Theory, IT-24(3), pages 337–343, May 1977. Another well-known method is the Ziv-Lempel 1978 method, described, for example, by Ziv et al. "Compression of Individual Sequences Via Variable Rate Coding," IEEE Trans. Information Theory, IT-24(5), pages 530–536, September 1977.

The LZ1977 method operates as follows: A sliding window, also termed the "history buffer," stores the most recent N characters of the input. The sliding window is then used as the dictionary. Each successive input character is then compared to each of the N previous characters within the sliding window. The address of each match within the sliding window is stored. A string is detected when an input byte matches a cell in the window and the succeeding input byte matches the succeeding cell in the widow. The LZ1977 method then, upon detection of a string of two or more characters, waits for final termination of the string. Final termination occurs when the string does not increase by one byte on the next cycle. When this is detected, the LZ1977 method outputs a pointer to the last character of the string within the N-sample sliding window. If two consecutive characters of the input do not match consecutive characters in the window, the first character is sent as raw data.

As stated above, the LZ1977 method, like other dictionary methods, achieves compression because, on average, each time a raw data string is replaced by a pointer to a location in the sliding window, it results in fewer bits than would have been required to represent the raw data. The amount of compression is therefore determined, in part, by the number of bits in the pointer which, in turn, is Log2(length of the buffer). On the other hand, a longer buffer increases the probability of and average length of a string match. The length of the buffer is therefore an optimization problem discussed extensively in the treatises.

To attain maximum compression, the LZ 1977 method uses what is termed "greedy parsing." Greedy parsing locates the longest from among all previous strings corresponding to an input sequence, and then transmits the pointer to that longest string. The general operation of the LZ1977 greedy parsing can be described by example. Assume that the words "ship" and "shipping" are both stored as a character sequence within the sliding window of N previous characters. Next, assume that the word "shipping" appears again in the input sequence. When the second character, "h," of "shipping" is received, the LZ1977 method will identify two stored strings "sh" as matching— the first corresponding to "ship" and the second to "shipping." This continues though the fourth received input bit, since the sequence "ship" is stored at two locations in the window. When the fifth character is received, however, the string corresponding to "ship" terminates. The second string has not yet terminated, since the fifth input character "p" is also the fifth in the string "shipping." The existence of the longer matching string prevents a pointer corresponding to "ship" from being output. This is the basis for the term "greedy parsing." Continuing with the example, if the next character in the input string does not match the next character of the stored after the string "shipping", the match is terminated and a pointer is transmitted. The pointer indicates both where in the sliding window the string for "shipping" terminates, i.e., the address of the last "g" character, and the length of that string.

The LZ1977 method may be performed in software, but is generally implemented by special purpose input/output (I/O) hardware because of the large number of operations-per-character required for the string matching and pointer generation.

A typical special purpose LZ1977 hardware compressor is shown, in block diagram form, in prior art FIG. 1. The FIG. 1 compressor comprises a history buffer, or array, 10, a priority select logic ("PS logic") unit 12 and a resolver encoder, also termed a prior encoder, unit 14. The array unit 10 contains N one-byte storage/one byte input content addressable memory (one byte CAM) cells, each holding one byte of data. A typical one byte CAM cell (not shown) comprises eight one-bit storage register, a write select line, a data input line, a match line MATCH[n,t], match enabling logic, and a match output line ML[n,t]. The input to the array 10 is the raw data DI(t), where t is the time or sample index. The array 10 operates as the N-sample sliding window of the LZ1977 method, and performs N−1 comparisons for each input byte DI[t] for identifying, as explained below, the end points of matching strings.

Referring to prior art FIG. 2, array 10 operates as follows, using an array size of N=8 as an example:

Beginning at t=0, input data DI[0] is written into the first of the array's eight storage locations (not shown), referenced as S[0]...S[7]. At t=1, the second input data DI(1) is written into S(1), (not shown). Also at t=1 the input data D(1) is compared against the data stored in S(0) and the CAM cell match line, MATCH[0,1], is enabled and output as ML[0,1]. A value of ML[n,t] means that DI[t] matched the content of S[n] at time t. There is a "0" output, at t=1, of the remaining CAM match lines MATCH[n,1] for n=1 to N−1. A disabling of ML[n,t], i.e., not enabling MATCH[n,t], is shown as an "X." There are two conditions where ML[n,t] is not enabled. The first condition is where no previous sample of the input data DI[t] is at the S[n] location. Accordingly, the first column of the ML[n,t] table of FIG. 2 has an "X" is shown in all locations since, at t=0, there are no previous samples of DI[t] in the array 10. The second condition is where the comparison is against the same S[n] location as DI[t] is being written into, which is why ML[n,t] is an X for all n=t(mod N). The reason for this disabling is that where n=t or n=tMod(N)the content of S[n] is DI[t] and it would be meaningless to the input date with itself.

Referring again to the overall system of FIG. 1, the N parallel ML[n,t] lines of the array 10 are input to the PS logic block 12. The operation of the PS Logic block 12 is described by the following set of coupled recursive equations:

$$PS[n,t]=ML[n,t-1] \text{ if } ORM[t-1]=0=M[n,t-1] \text{ if } ORM[t-1]=1 \quad (1)$$

where $$ORM[t]=M[0,t] \text{ OR } M[1,t]... M[N-1,t] \quad (2)$$

and $$M[n,t]=ML[n,t] \text{ AND } PS[n-1,t]. \quad (3)$$

Substituting variables, equation (3) can be rewritten as:

$$M[n,t]=ML[n,t]* ML[n-1,t-1] \text{ if } ORM[t-1]=0=ML[n,t]* M[n-1,t-1] \text{ if } ORM[t-1]=1 \quad (4)$$

The variables on the right side of equations (1)–(3) are known and are used to solve for the left side. Based on the above Equations (1)–(3), the PS logic block 12 sets ML[n,t−1]=1 at the beginning of a string match. As can be seen from Equations (1)–(3), a string match occurs at the first sequence of two characters in the input sequence DI[t] that match a sequence of two characters stored in the array 10, setting M[n,t] to "1". M[n,t]="1" does not mean that the corresponding string will not increase by one byte on the next clock cycle. Final termination of a string is indicated by the ORM[t] signal according to Equation (2).

The generation of ORM[t] is shown by the following example: Assume an eight-sample array 10, having S[0] through S[7]. Assume that at time t=0 the characters "t", "o" and "p" are stored in locations S[1], S[2], and S[3], respectively, and the sequence "t", "o", and "m" is stored in locations S[4], S[5] and S[6]. Next, assume that an input sequence "t", "o", "p", and "0" is input as D[0], D[1], D[2], and D[3].

The input "t" at t=0 is compared to the contents of each S[n] address except S[0], which is the cell the input byte is written to at t=0. In this example, there is a match with the "t" in S[1] and S[4] and, therefore, ML[1,0]="1" and ML[4,0]="1". The value of M[1,0] and M[4,0] will not be "1", however, because, looking to Equation (3) a match of only one character without a previous carry bit will not establish a string. The carry bits, however, PS[1,0] and PS[4,0] will be set to "1", as shown in Equation (1).

At the next clock, t=1, there is a match between the input "o" and the "o" contents of S[2] and S[5], and thus ML[2,1] and ML[5,1] are equal to "1". The "o" character is written into S[1]. Based on the equations for M[n,t] shown above, together with the previously calculated carry bit PS[1,0] and PS[4,0], M[2,2] and M[5,2] are set equal to "1". M[2,1] and M[5,1] having a value of 1 results in ORM[1] having a value of "1", since ORM[t] is the logical OR of M[n,t] for all n. Also at t=1, PS[2,1] and PS[5,1] is set to "1", based on Equation (1) above, and DI[1] is stored in location S[1]

On the next clock, t=2, there is a match between the input "p" and the content of S[3], and ML[3,2] is thus equal to "1". However, there is no match between input "p" and the "m" content of S[6]. Based on the equations for M[n,t], therefore, M[3,2] will equal to "1" but M[6,2] will be equal to "0". The input's match against the "tom" string at S[4] through S[6] has terminated at S[5]. M[3,2] having a value of "1" results in ORM[2] having a value of "1", since ORM[t] is the logical OR of M[n,t] for all n, even though M[6,2] is equal to "0". Therefore, ORM[t] indicates that a string, i.e., the "top" string at S[1] through S[3] is continuing.

On the next clock, t=3, however, the input byte of "0" does not match the "t" character in S[4]. Therefore, ML[3,3] will be equal to "0" and, hence, M[3,3] is equal to "0". Based on the Equation (2) above, ORM[3] will have a value of "0". The longest sequence in the array 10 corresponding to the example input sequence "top0", which is the "top" sequence stored at t=0 at S[1] through S[3], is thus indicated as terminated by ORM[t]. The output sequence of ORM[t] for the above example is "0110", with the string termination where ORM [t] changes from a "1" to a "0".

When ORM[t] changes from "1" to "0", the PS Logic unit 12 finds the lowest n for which M[n,t] is equal to 1. This corresponds to the location within the array 10 for the longest string match and, if more than one are of identical length, the lowest n. Accordingly, PS Logic unit 12 identifies the longest matching string within the array buffer 10.

FIG. 3 illustrates the operation of PS Logic block 12 in accordance with equations (1) through (4), as implemented on a prior art one-byte per location and one-byte input content addressable memory CAM processor of FIG. 2.

The example ML[n,t] array depicted in FIG. 3 indexes storage locations as rows, n, and indexes time increments as columns, t. The FIG. 3 matrix values are based on a random input sequence. As described above, cycles in which ORM(t)is="1" before changing to "0" are cycles in which one or more strings terminate. Looking to FIG. 4, the address of the terminating string within the array 10 is the lowest n (highest toward the top) of the M [n,t] matrix in the column t corresponding at the point t where ORM(t) is "1" before changing to "0". The string length is one plus the number of cycles of t for which ORM(t)="1" prior to changing to "0". Referring to FIG. 3, a string length of 4 is shown as terminating at t=5, at address n=3. A string of length 2 terminates at t=9, at address n=2. If two or more strings start and stop at the same time, i.e., an input string and two or more strings stored in the array 10 are identical, the Priority Select block 12 will pick the lowest n.

As stated above, the prior art LZ1977 methods and hardware process the input stream at one byte per cycle. Therefore, looking to Equation (3) it can be seen that the M[n,t] output represents a match which can happen on only one path from the previous M[n−1,t−1]. More specifically the only path is where PS[n−1,t−1] is equal to "1" and, at the next clock, t, the match ML[n,t] is equal to "1". This path, or trajectory, is shown as M[n,t] in FIG. 4. Accordingly, the hardware for one-byte-per-cycle string matching must only account for that one trajectory.

The one-byte-per-cycle methods and hardware of the related art, although pipelined and paralleled where possible for the maximum operations-per-cycle, is, by definition, inherently limited in its overall throughput to one character, or byte, per machine cycle. Accordingly, as the present inventor has recognized, a significant throughput advantage can be gained by performing the string match at two or more bytes per cycle. There are however, several reasons why the related art cannot perform string match processing at more than one byte per cycle. One, which is discussed in greater detail in the Description of the Preferred Embodiments below, is that optimal parsing for LZ1977 and related algorithms requires that the input string be parsed to a resolution of one byte. In other words, even if the parsing is performed in two bytes-per-cycle, the hardware must discriminate between a termination at the second, or odd byte, and a termination at the first, or even byte, of the input byte pair. The present art, in addition to lacking means for inputting, matching, and storing the input string at two-bytes-per-cycle, lacks any means for discriminating between an even and odd byte termination.

Another fundamental shortcoming of the related art single-byte-per-cycle methods is that detecting a string termination based, for example, on two consecutive bytes of the input data being matched, in one machine cycle, against the contents of the history buffer, requires tracking of three or more trajectories from the results of the previous input byte-pair being matched against the history buffer contents.

A co-pending application Ser. No. 228,321, filed Apr. 15, 1994, entitled "A Method and Means For Character String Pattern Matching For Compression and the Like Using Minimal Cycles Per Character", which is referenced herein as "Application '321" identifies what it terms a multi-byte-per-cycle dictionary compression. However, the method and hardware described in Application '321 will not produce a correct or usable compression output for all input sequences. This can be seen by referring to Related Art FIG. 5, which is a redrawing of the match detect logic associated with one of the 8 separate one-byte storage locations contained in the composite system of Application '321 FIGS. 4B.1, 4C.1 and 4C.2. The only output of the FIG. 4 match detect logic is PS[n,t], which is identical to PS[n,t] for the prior art single-byte-per-cycle method of FIG. 1.

Referring back to Equations (3) and (4) describing M[n,t] for the prior art single-byte-per-cycle method, it is clear that the termination identifier M[n,t] is a function of the match line for n, ML[n,t], ANDed with the carry information PS[n−1,t]. The reason is that for M[n,t]=1, when parsing one one byte per cycle, requires concurrence of only two conditions. One is a match at n at time t. The other is a match at n−1 at the previous time t−1. However, as can be seen from the Description of the Preferred Embodiments below, if the input is processed two-bytes-per-cycle there are three conditions that can produce a match signal M[n,t] at location n.

Further, when processing at one-byte-per-cycle a final termination, i.e., where a string terminating at location n at time t does not terminate at location n+1 at time t+1, is at that byte location n. Referring to related art FIG. 2, this is the n value of M[n,t] occurring where OR[t] transitions from "1" to "o". However, as stated above, a string from a two-byte-per-cycle input can terminate at either the even or the odd byte. The PS[n,t] information of Application '321 is insufficient to detect all of the three state conditions which, for a two-byte-per-cycle input, produce a string termination, M[n,t], at location n, and is insufficient to determine whether a string terminated at the even or odd byte of the input. Accordingly, Application '321 does not disclose a complete or realizable two-byte per cycle compression method.

For the foregoing reasons, a need exists for a two-byte-per-cycle method and means for implementing LZ1977 and other dictionary-based string matching processes.

SUMMARY OF THE INVENTION

It is therefore an object of the present invention to provide logic and circuitry for performing a two-byte per cycle string comparison.

It is another object of the invention to encode and decode according to the LZ1977 and related algorithms using a two-byte per cycle processing.

It is another object of this invention to encode and decode, according to the LZ1977 and other dictionary-based string-match algorithms, two-byte per cycle processing using the same physical storage locations.

It is still another object of this invention to provide an alternate array control to simplify and reduce the required hardware for two-byte per cycle string comparisons.

These and other objects, aspects and advantages of the present invention will be more fully understood to one of ordinary skill from the detailed description hereinbelow.

BRIEF DESCRIPTION OF THE DRAWINGS

FIG. 3 depicts simulation-based outputs for each of the data-flow blocks of the related art single-byte-per-cycle system of FIG. 1.

FIG. 4 is a diagram showing the match trajectory of the one byte per cycle systems of FIG. 1.

FIG. 12 shows a simulation result representing an operation according to the FIG. 6 embodiment.

FIG. 13 is match blocking scheme for second embodiment of the present invention.

DETAILED DESCRIPTION OF A PREFERRED EMBODIMENT OF THE INVENTION

For the purposes of this description, and unless otherwise specified, the values "1" and "0" are logical one and logical zero, respectively, or logical true and logical not true. These logical values can be represented in the hardware by any of the systems of signal polarities and magnitudes known in the art. The terms "AND" and "OR" are defined as the Boolean functions AND and OR, respectively.

Figure 6:
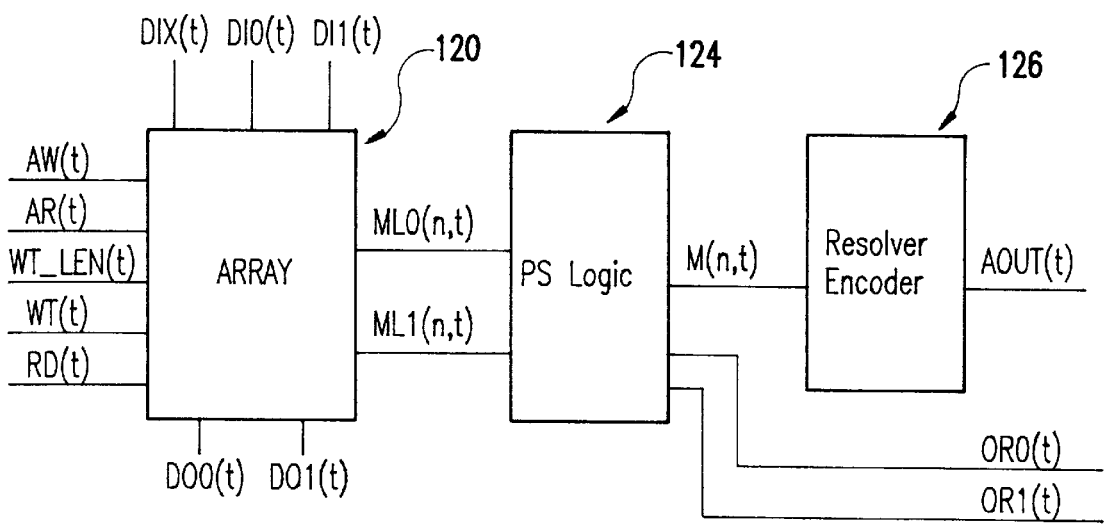
FIG. 6 is a block diagram of a two-byte-per cycle string matching system according to the present invention

Referring now to FIG. 6, a first embodiment of a two-byte per cycle string-match encoder/decoder system according to the present invention is shown. This embodiment comprises an array 120 having N one-byte write and compare cells 122, a two-byte PS Logic unit 124 and a Resolver Encoder 126.

The array 120 operates as the dictionary or history buffer of the compression system, and is analogous, in terms of its general function, to the history buffer or array 10 of the related art single-byte-per-cycle systems. The array 120 comprises N one-byte storage cells 122, each cell indexed S[n], n=0, N-1.

Figure 7:
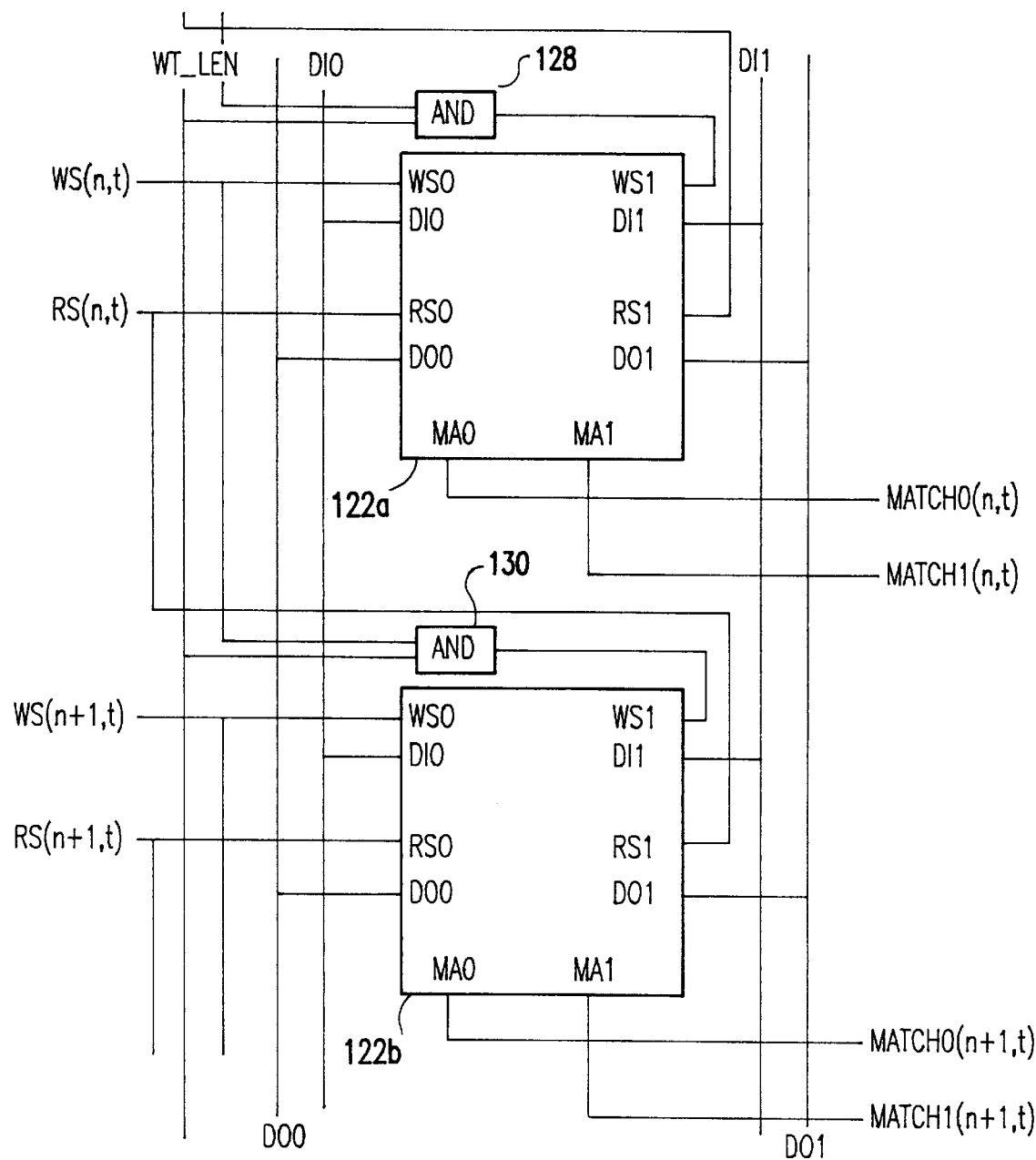
FIG. 7 shows an even-odd content addressable random access memory cell for an array according to a first embodiment.

The storage cells 122 of this particular embodiment are content addressable random access memory ("CRAM") cells, arranged as even-odd pairs 122a and 122b, as shown in FIG. 7. A CRAM has the random access read/write function of a RAM and the content addressable memory function of a CAM. More specifically, a CRAM can perform a write to any location, a read to any location and a compare operation to all locations. The CRAM implementation for the one-byte cells 122 provides operational flexibility, and allows full compatibility with existing single-byte-per-cycle processed data, as is described further below. A simpler CAM implementation is optional if full compatibility is not required, or if a slightly reduced compression performance is tolerable.

Referring now to FIG. 7, the even-odd CRAM arrangement consists of an even CRAM cell 122a, an odd CRAM cell 122a, an AND block 128 and an AND block 130. As stated previously, each cell 122 stores one byte, and therefore each consists of eight one-bit CRAM cells (not shown). Each of the CRAM cell 122a and 122b has ten ports—data in DI0, data out DO0, data in DI1, data out DO1, write select WS0, write select WS1, read select RS0, read select RS1, match MA0 and match MA1. Using well-known standard design methods, each of the eight one-bit CRAM cells comprises approximately 16 field effect transistors (FETs).

Figures 8, 9:
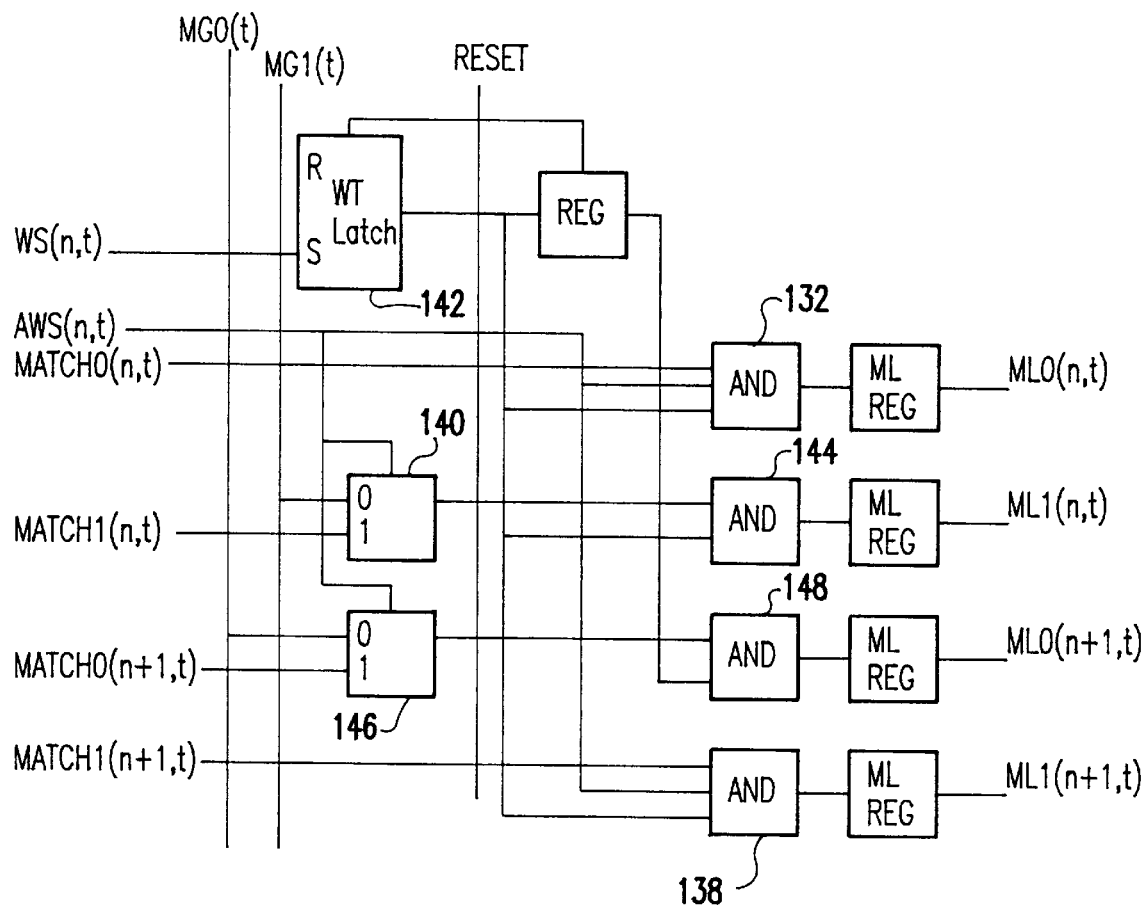
FIG. 8 shows a match line blocking logic circuit for the embodiment of FIG. 6.
FIG. 9 depicts a match line blocking scheme according to a first embodiment of the invention.

The even-odd arrangement of CRAM cells 122a and 122b shown in FIG. 7 operates as follows, where 122 encompasses 122a and 122b as a unit: When DI0[t] matches the stored byte, the output MATCH0[n,t] will be "1". When DI1[t] matches the stored byte, the output MATCH1[n,t] will be "1". MATCH0[n,t] and MATCH1[n,t], if enabled by the match logic of FIG. 8, are output by the array 120 as match lines ML0[n,t] and ML1[n,t]. Referring again to FIGS. 6 and 7, the WS[n,t] and RS[n,t] inputs to each cell 122 are determined by primary address inputs AW[t] and AR[t] to the array 120, respectively. Generation of AW[t] and AR[t] is not shown, but is readily implemented by standard address sequencing logic. For compression, the write address AW[t] is an incrementing counter (not shown) to realize a wrap-around buffer operation of the array 120. Generation of AR[t] for compression, for this embodiment, realizes a read of the n+1 CRAM cell 122 one clock cycle t prior to writing to the n+1 location, as will be described below. The second embodiment of this invention, as described below, does not require a read-before-write of the n+1 cell 122 and, therefore, does not require input of a read address AR[t] during compression.

AW[t] and AR[t] are decoded by an array address decoder (not shown) into cell write select WS[n,t] and cell read select RS[n,t] for unique write and read storage locations within the CRAM array. For this embodiment, byte DI0[t] is written to even location n when WS[n,t] is "1". Byte DI1[t] is written to odd location n+1 when WS[n,t] is 1 and WT_LEN is 1, where WT_LEN indicates that two bytes are being written during cycle t. Accordingly, in this embodiment, two-byte-per-cycle compression addresses only even WS lines.

During decompression, when RS[n,t] is "1" DO0[t] is read from location n and DO1[t] is read from location n+1. During decompression, both RS[n,t] and WS[n,t] can be selected on even or odd boundaries.

Referring to FIG. 6, RD[t] is a global read enable line which enables the RS[n,t] line for each cell 122 by an AND gate or equivalent enabling logic (not shown). Similarly, WT[t] is a write enable which enables the write select WS[n,t] for each cell 122.

The initial raw data sequence DI[t] (not shown) is input every time increment "t" to the array 120 in two-byte pairs, referenced as DI0[t] and DI1[t]. The array 120 with its N one-byte CRAM cells 122 performs two general operations per input cycle on the input data pair DI0[t] and DI1[t].

One of the operations stores DI0[t] in cell S[n] and stores DI1[t] in S[n+1], where n is incremented (or decremented) to realize a wrap-around buffer N-length sliding window (or dictionary) operation of the N cells.

The other operation compares the input pair DI0[t] and DI1[t] against the contents of each of the N S[n] cells, (except for the two consecutive cells into which the input pair is being written and cells into which no data has yet been written, as described below) and generates a result set of MATCH0[n,t] and MATCH1[n,t] according to DI0[t] and DI1[t] as discussed above.

As stated above, the array 120, for this embodiment, does not utilize, or enable, the MATCH0[n,t] and MATCH1[n,t] from S[n] cells 122 into which data is being written, or against S[n] cells into which no data (from the file being compressed) has yet been written. The reason for disabling MATCH0[n,t] and MATCH1[n,t] from S[n] cells where data is being written at time t is that the contents would be the input data and the comparison would thus be meaningless.

The input signals MG0[t] and MG1[t] will now be described.

Figures 1, 2:
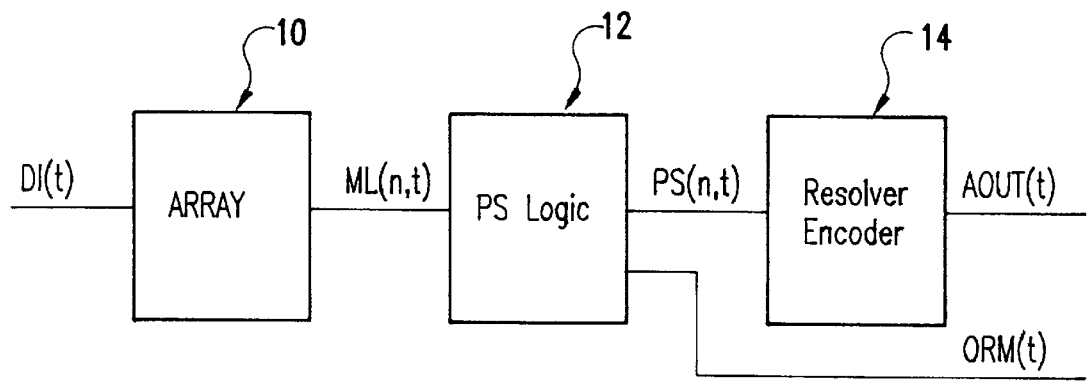
FIG. 1 is a block diagram of a related art single byte-per-cycle dictionary-based encoder/decoder.
FIG. 2 shown the match enable sequence for related art single-byte-per cycle string comparison.
Figure 5:
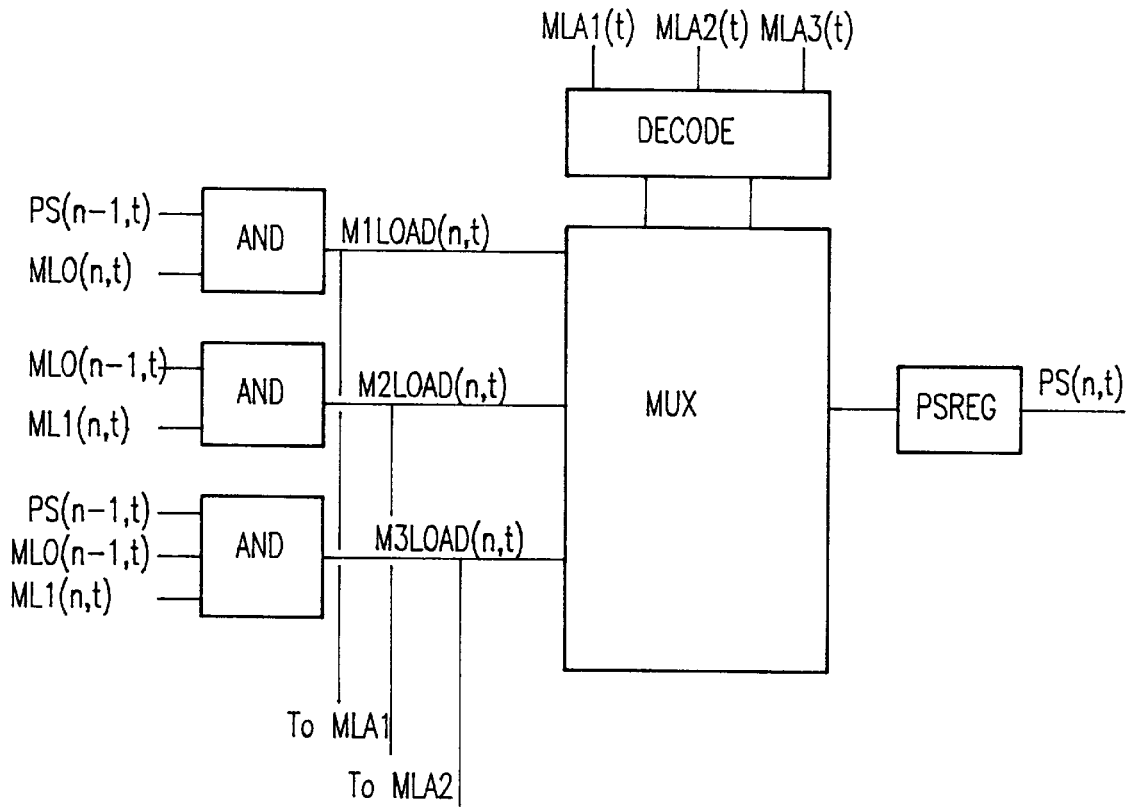
FIG. 5 depicts the match detect logic for a related art incomplete multi-byte per cycle string parsing.

This invention contemplates a plurality of options for the above-identified input data to S[n] match timing issue. The first option, which is employed for this particular embodiment, enables the ML0[n,t] and ML1[n,t] lines in a sequence shown in FIG. 9. This sequence corresponds to the FIG. 2 scheme used for the match lines ML[n,t] of the single-byte-per-cycle array 10. Referring to FIG. 9, the sequence is obtained by arranging the ML0[n,t] and ML1[n,t] arrays as parallels of the ML array of the one-byte system of FIG. 1.

It can be seen that the FIG. 9 scheme disables only one cell's comparators per cycle and, hence, achieves the same compression performance, e.g., IBM's ALDC standard, as attained by the single-byte-per-cycle blocking of one cell per cycle.

There is, however, additional logic required for the present invention to block only one cell per cycle. More particularly, the present invention inputs the data in two-byte blocks instead of one byte at a time. Therefore, at every clock cycle t the even byte DI0[t] is stored in location n at the same time the odd byte DI1[t] is stored in location n+1. To use the enablement sequence of FIG. 9 thus requires additional logic, since location n+1 is being overwritten on the same cycle that DI0[t] must be compared to the n+1 content, and location n is being overwritten at the same time that DI1[t] must be compared to that n content.

For the above reason, this particular embodiment implements the array 120 as an array of N content addressable random access ("CRAM") cells, an even-odd pair of which are depicted in FIG. 8. The CRAM cell is, by definition, readable by address as well as content, and this read function allows the n+1 storage location to be read prior to its being written. The read-out content is then compared to the data input byte, thus obtaining all cell comparisons performed by the single-byte-per-cycle method.

Referring to FIGS. 6 and 7, the read is accomplished by inputting the address for n+1 on the AR[t] array address lines, and thus byte-retrieve the n+1 content, just prior to writing that location. The n+1 content is output from the array onto a line called DIX[t] and latched by a global register (not shown). The DIX[t] output of the global register (not shown) is then compared by a comparator (not shown) to the DI0[t] byte. The comparison result is input to the array as global signal MG0[t]. MG0[t] represents the ML[n+1,t] value that would have been obtained for a single-byte-processing. The reason is that, for single-byte parsing, ML[1,0] is the comparison of the first byte, DI[0], with S[1] at t=0. For the two-byte-per-cycle parsing of the present embodiment, the comparison of the first byte, DI1[0], with S[1] is not possible at t=0 because, at that same increment t=0, the contents of S[1] are being written with the odd byte, DI1[0], of the input pair. At t=0, however, the pre-read S[n+1] is S[1]. Storing S[1] as DIX[0], and then at time t=0 comparing it to the first input byte, DI0[0], obtains an MG0[t] value identical to ML[1,0] of the single byte parsing. Referring to FIG. 8, MG0[t] is multiplexed into ML0[n+1,t], when WS[n,t]=1 and the WT latch is set. The WT latch being set implies that location n+1 contains valid data.

One additional byte comparison, of DI0[t] with DI1[t], completes, for this embodiment, the compensation for S[n] and S[n+1] being written in one cycle. This comparison is performed by a global comparator (not shown), and input as MG1[t] to the array 120. MG1[t] has the same value as the single-byte method's ML[n,t+1], which, because of the present invention's writing of S(n) and S[n+1] in one cycle, is not directly available. More particularly, for the single byte method, at t=0, the first byte, DI[0], is written to S[0], and ML[n,0] is generated for all n>0, assuming all cells S[n] have already been written to. Next, at t=1, the second byte, DI[1], is written to S[1] and ML[n,1] is generated for all n not equal to 1, including n=0. ML[0,1] represents the comparison of the second byte to S[0]. S[0], however, contains the first byte of the input string. Therefore, ML[0,1] is actually the comparison of the first and second bytes of the input stream. The present embodiment, therefore, compensates for not being able to compare an odd byte DI1[t] with S[n] when it is being written to S[n+1] by comparing DI0[t] and DI1[t] and inputting the result as MG1[t]. Referring to FIG. 9, MG1[t] is multiplexed into ML0[n,t] for each n indicated by an "X" showing that ML0[n,t] is blocked out.

The particular logic for enabling and disabling the match lines MATCH0[n,t] and MATCH1[n,t], for this example embodiment, is shown in FIG. 8. The logic of FIG. 8 was selected to accommodate the above-identified MG0[t] and MG1[t] solution for the single-cell per cycle blocking of FIG. 9. As will be described in a further embodiment, an alternate blocking scheme, having reduced single-byte-per-cycle data compatibility, and reducing the size of the historuy buffer by one byte, is used, the match blocking logic of FIG. 8 can be reduced.

Referring to FIG. 8, the match logic of this embodiment operates as follows: When location n is written to the write select WS[n,t] is ="1". Therefore, ^WS[n,t]="0". ^WS[n,t]="0" forces the ouputs of AND gates 132 and 138 to "0". ML0[n,t] and ML1[n+1,t] are therefore disabled. ^WS[n,t] of "0" switches the 2:1 multiplexer 140 to select MG1[t] instead of MATCH1[n,t]. The latch 142 holds the WS[n,t] value of "1" on one input of AND gate 144. AND gate 144 thereby enables the output of multiplexer 140 and outputs M1G[t] as ML1[n,t]. ^WS[n,t] of "0" switches the 2:1 multiplexer 140 to select MG1[t] instead of MATCH1[n,t]. ^WS[n,t] of "0" also switches the 2:1 multiplexer 146 to select MG0[t] instead of MATCH0[n+1,t]. The latch 142 also holds the WS[n,t] value of "1" on one input of AND gate 148, thereby enabling the output of multiplexer 146 and outputs M0G[t] as ML0[n+1,t). As seen from the description, two match line outputs, ML0[n,t] and ML1[n+1,t], are blocked for each two-byte write. One cell is therefore blocked for each input byte, which is same as the one-cell blocking of the single-byte method Referring to FIG. 6, the N lines ML0[n,t] and N lines of ML1[n,t], representing the match information for the DI0[t] and DI1[t] byte pair, are output from the array 120 to the PS logic unit 124 at each time t. As will be described below, information sufficient to determine, for each time increment t, if a string has ended at each S[n] location is contained in the match line values ML0[n,t] and ML1[n,t] for that location, and the preceding locations S[n−1] and S[n−2] obtained at the previous time increment t−1. That information is also sufficient to determine if the string ended at the odd or even byte relative to the input signal pairs DI0[t] and DI1[t].

The operation of the PS Logic unit 124 will now be described. The overall transfer function of the PS Logic unit 124 is to set M[n,t] equal to logical "1" if a string terminates at location n at time t. What is meant by "terminates", to the extent indicated by M[n,t]="1", is a still-running string which, as of time t, terminates at the nth location. This does not mean that the string cannot extend to n+1 at the next time increment t+1. As will be described further below, the final termination position of the string, i.e., where it does not extend to n+1 at the next time increment t+1, is indicated by OR0[t] and OR1[t] signals output by the PS Logic unit 124. As will be described, the OR0[t] and OR1[t] signals correspond to the OR[t] signals of the prior art single-byte methods, with OR0[t]=OR[2*t], and OR1[t]=OR[2*t+1].

M[n,t] is set by the PS Logic Unit 124 at each time increment t, and for each location n in the S[n] array set. The PS Logic unit 124 sets M[n,t] by selecting one from among three match information values, M0[n,t−1], M1[n,t−1] and M2[n,t−1], which it calculated at the previous time increment t−1. The match information values M0[n,t−1], M1[n, t−1] and M2[n,t−1] are a function of the array 120 match lines ML0[n,t−1] and ML1[n,t−1] for that nth location, and carry bits PS[n−2,t−1] and PS[n−1, t−1] from the two preceding S[n] locations. The state equations defining the match information values M0[n,t−1], M1[n,t−1], M2[n,t−1], and the carry information bits PS[n,t] and M[n,t] are shown below:

M0[n,t]=PS[n−1,t] AND ML0[n,t] (4)

M1[n,t]=ML0[n−1,t] AND ML1[n,t] (5)

M2[n,t]=PS[n−2,t]AND ML0[n−1,t] AND ML1[n,t] (6)

Figure 10:
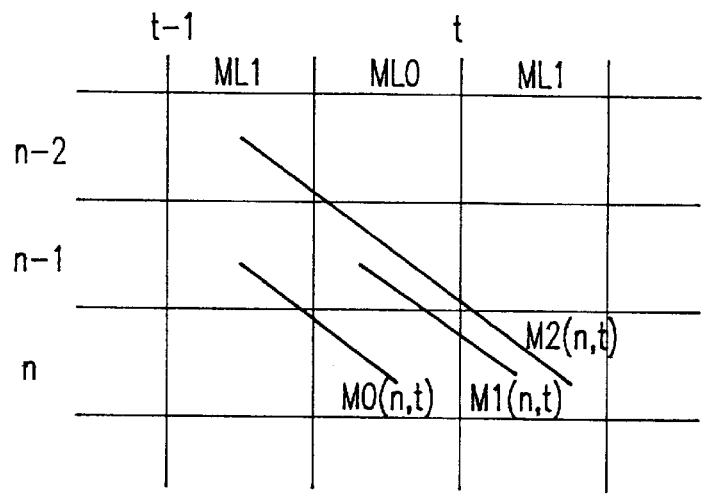
FIG. 10 is a graphical diagram of the match trajectories for the two byte per cycle matching of the invention.

Referring to FIG. 10, Equations (4),(5) and (6) reflect the three possible trajectories of match lines ML0[n,t] and ML1[n,t], from their values at previous time increments t−1 and preceding cells n−1 and n−2, to their values at cell n at time t.

The first trajectory, represented by M0[n,t] and Equation (4), is where a match has occurred between the first byte of the input DI0[t] and the contents of the nth location S[n], and there is a carry from the preceding cell location S[n−1], which is represented in Equation (4) as PS[n−1,t].

The second trajectory, M1[n,t] of Equation (5), is where there is a match, ML0[n−1,t],between the lower byte of the input pair, DI0[t], and the contents of the cell S[n−1], and a match, ML1[n,t], between the upper byte of the input pair, DI1[t] and the contents of the cell S[n]. Note that this condition establishes a string not conditional on carries from preceding cells or time increments. The reason is that if the lower byte DI0[t] matches a cell S[n−1] and the upper byte DI1[t] matches the next S[n] then (at least) a two-byte string must exist and, at time t, terminate at S[n].

The third trajectory, M2[n,t] of Equation (6), is the previous M1[n,t] condition and a carry from the preceding cell S[n−2]. As will be shown further below, this third trajectory, M2[n,t] represents a necessarily longer string than the second trajectory alone and, therefore, is selected as the highest priority termination.

Selection from among the M0[n,t], M1[n,t] and M2[n,t] match information is based on the result from logically ORing the match information values over all n, from n=0 to N−1, at each time increment t. The OR operation yields three global selection signals, labeled ORM0[t], ORM1[t] and ORM2[t], defined as:

$$ORM\,0[t] = \sum_n M0[n, t] \quad (7)$$

$$ORM\,1[t] = \sum_n M1[n, t] \quad (8)$$

$$ORM\,2[t] = \sum_n M2[n, t] \quad (9)$$

As stated previously, the carry bits PS[n,t] contain information upon which string termination at succeeding cell locations S[n+1] and S[n+2] at the next time increment T+1 is conditional. The PS Logic Unit 122 therefore stores PS[n,t] for each location S[n], at each time increment t.

The carry bits are set according to the following rule:

$$PS[n, t] = M2[n, t-1] \text{ if } ORM2[t] = 1 \quad (10)$$
$$= M1[n, t-1] \text{ else if } (ORM1[t] \text{ AND NOT } ORM0[t]) = 1$$
$$= ML1[n, t-1] \text{ otherwise.}$$

In other words, PS[n,t] is set equal to the M2[n,t−1] match condition if any M2[n,t−1], for n=0 to N−1, is set; else is set equal to the M1[n,t−1] match condition if any M1[n,t−1], for n=0 to N−1, is set; and else is set to the ML1[n,t−1] match line condition otherwise.

The PS Logic unit 124 sets its output string termination values M[n,t] by selecting, on a priority basis, from among M0[n,t], M1[n,t] and M2[n,t], according to the following rule:

$$M[n, t] = M2[n, t-1] \text{ if } ORM2[t-1] = 1 \quad (11)$$
$$= M0[n, t-1] \text{ else if } ORM0[t-1] = 1$$
$$= M1[n, t-1] \text{ otherwise}$$

The priority rules above are commensurate with LZ and similar string-match algorithms, which suppress a new string termination in the presence of a previously running string's termination. Therefore, M2[n,t] masks all other matches because, by its definition in Equation (6) above, M2 is the termination of a string of more than two bytes. M0[n,t] matches have the next highest priority because, in the absence of M2[n,t], M1[n,t] represents a two-byte string that has just begun at t−1. This is clear from Equation(5), which shows M1[n,t] as not depending on a carry information PS[n,t]. M0[n,t], on the other hand, requires a carry information (PS[n−1,t−1], referencing t to the output time for M[n,t]), and therefore represents termination of a string that begins prior to t−1.

Figure 11:
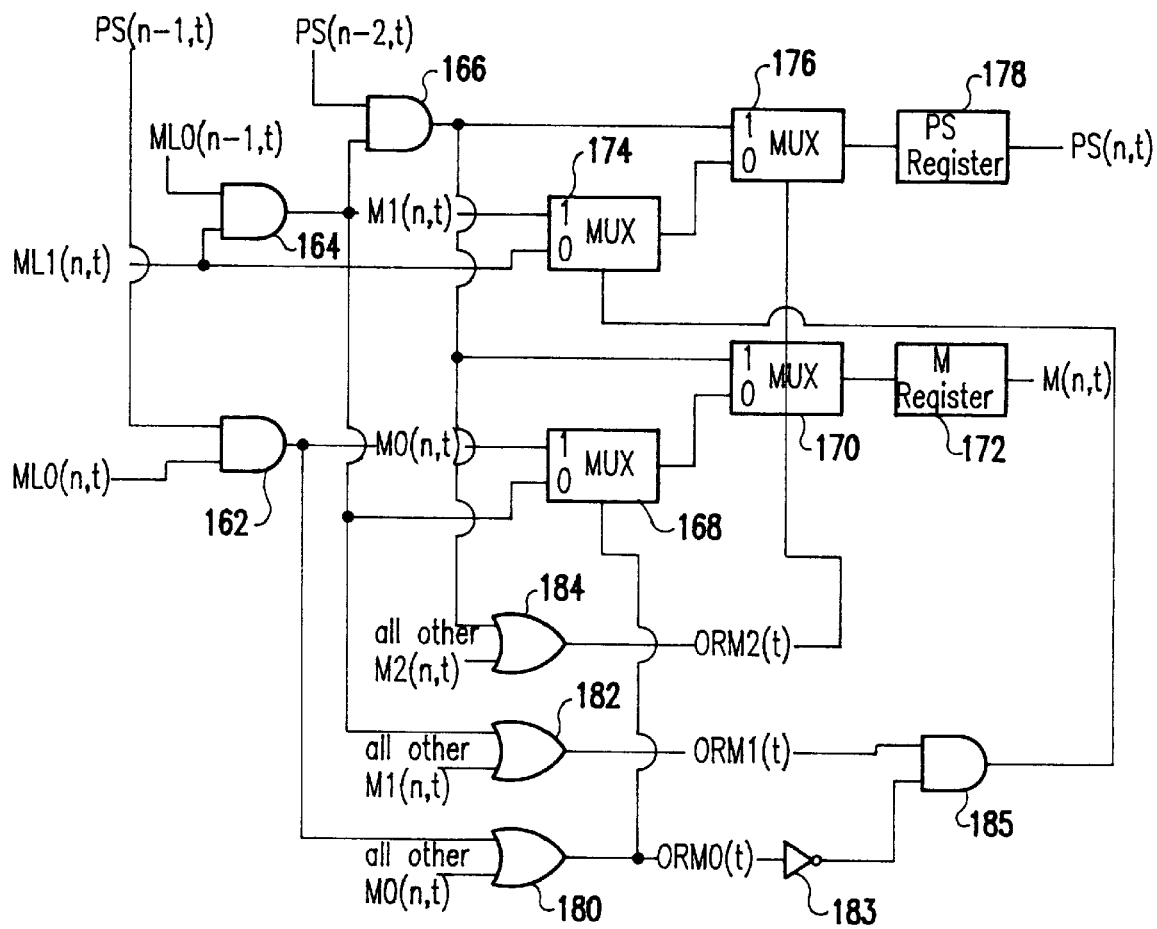
FIG. 11 depicts one block of the priority select logic for the embodiment of FIG. 6.

An example hardware implementation of the PS Logic Unit 124 comprises N blocks of the two-byte PS Logic Block 160 shown in FIG. 11. As depicted, Logic Block 160 comprises AND units 162, 164 and 166, which implement Equations (4)(5)and (6)above for M0[n,t], M1[n,t] and M2[n,t], respectively. The unit 130 also comprises 2:1 selectors, or multiplexers 168 and 170, which implement the priority selection function, shown by Equation (11) above, for outputting M[n,t]. M[n,t] is shown as latched by register 172. The unit 160 further comprises 2:1 multiplexers 174 and 176 for implementing the PS[n,t] carry selection function, shown by Equation (10) above. PS[n,t] is shown as latched by register 178. Global OR units 180, 182, and 184 receive M0[n,t], M1[n,t] and M2[n,t] from each the N PS logic units 130 to implement the ORM0[t], ORM1[t] and ORM2[t] Equations (7),(8) and (9) above. To complete the implementation of the PS[n,t] equation (10), the ORM0[t] output of OR gate 180 is inverted by unit 183, then ANDed by gate 185 with the ORM2[t] output of OR gate 182, which is connected to multiplexer 174, while the ORM2[t] output of OR gate connects to multiplexer 176.

To implement the M[n,t] equation (11) above, the ORM0 [t] output of OR gate 180 connects to multiplexer 168, and the ORM1[t] output of OR gate 182 connects to multiplexer 170.

As also shown in FIG. 11, as per Equation (4) above, the input to AND unit 162 receives PS[n−1,t], which is generated by the preceding the PS logic block (not shown but identical to the depicted 160), and the match value ML0[n,t] from the array 120. Similarly, as per Equation (6) above, the input to AND unit 166 receives PS[n−2,t], which is generated by the next preceding the PS logic block (not shown but identical to the depicted 160, and the AND 164 output of match values ML1[n,t] and ML0[n−1,t] from the array 120.

The specific topology for the connection from the array 120 to each of the two-byte PS logic blocks 160 is not shown, but various methods are readily apparent to one of ordinary skill. Also, intermediate latch registers (not shown) might be included, for example, between each array 120 match output ML0[n,t] and ML1[n,t] and the two-byte PS Logic Blocks 160, as well as, for example, between PS[n−1,t] of one unit 160 to the AND block 164 of the next unit 160.

Referring to FIG. 12, the output of the PS Logic Unit 124 at each time increment t is the set of N parallel signals M[n,t], for n=0 to N−1, and the data pair OR0[t] and OR1[t], where $$OR0[t]=ORM0\ [t] \qquad (12)$$

$$OR1[t]=ORM2\ [t]\ OR\ (ORM1[t]\ AND\ NOT\ ORM0[t]) \qquad (13)$$

The OR0[t] and OR1[t] signals represent the termination of a string in a manner similar to the representation of ORM[t] of the single-byte-per-cycle methods of the prior art, but in one-half the number of clock cycles. Basically, as can be seen from Equation (12) above, OR0[t]=1 means that there is a matching string terminating, as of time increment t, at an even column of a cycle, in other words a string terminating with a match of the lower byte DI0[t]. OR1[t]=1 means that there is a matching string terminating, as of time increment t, at an odd column of a cycle, in other words a string terminating with a match of the upper byte DI1[t].

OR0[t] and OR1[t] are further depicted in FIG. 12, which shows a two-byte-per-cycle compression according to the present invention, using the same input sequence as in the related art FIG. 3. To compare OR0[t] and OR1[t] of this example embodiment to the OR[t] outputs of the single-byte-per-cycle example of FIG. 3, the outputs are read OR0 to OR1 in one cycle, and then to OR0 followed by OR1 in the next cycle. Referring to FIG. 12, the simulation shows three consecutive is in the OR0[t] and OR1[t] data, starting at the odd location at cycle 1, which is shown as OR1[1]. Since the outputs are read from OR0 to OR1 to OR0 the string of is terminates at OR1[2]. Referring to the FIG. 12 M matrix shown above the depicted OR0 and OR1 sequence, there is a "1" in the fourth row (counting down from the top) at the third column (corresponding to cycle 3 where the OR0 and OR1 sequence of is ends, showing the string terminating). Thus, at cycle 3 a string terminates at address 3 in the dictionary, which is S[3] in the array 120. The length of the string is established in the same manner as the length of the string in the single-byte-per-cycle method, namely by adding "1" to the number of consecutive 1's contained in the OR0 and OR1 sequence. For this example, the string ending at address 3 is indicated by a sequence of 3 consecutive 1s in the OR0 and OR1 sequence, and therefore has a length of 4. Comparing the OR0[t], OR1[t] and M[n,t] patterns in FIG. 12 with the OR[t] and M[t] patterns of the related art FIG. 3, shows the two-byte-pre-cycle method of the present invention as outputting identical compression data.

Referring to FIG. 6, the N M[n,t] output lines of the PS Logic Unit 124 are input to the Resolver/Encoder 126 which selects, based on a predetermined priority rule, one from among (if there are) multiple M[n,t] lines equal to "1" at each time t, translates its position into and outputs it as a word AOUT[t] of bit length Log(base2)N. The priority rule for this embodiment is the lowest n which, referring to FIG. 12, is the highest toward the top of the M[n,t] matrix. Other rules of priority selection could be used but, whichever rule is chosen, it must be consistent to enable decoding or decompression. A commercial hardware implementation for the Resolver/Encoder 126 is, for example, SGS-Thompson part No. HCC4532B, or any available equivalent.

The sequence OR0[t] and OR1[t] is used by the output logic unit (not shown) to generate the string length data (not shown), which is inserted in the string length field (not shown) of the compressed final output data. The final output logic (not shown) is substantially identical to the output logic (not shown) of the prior art single-byte-per-cycle methods. The only modification required is that OR0[t] and OR1[t] are received at each clock instead of just OR[t] of the single-byte method. However, OR0[t] and OR1[t] correspond in function and overall sequence to the OR[t] sequence output by the PS Logic Unit 12 of the single-byte-per-cycle LZ 1977. Accordingly, the minor modifications to the final output logic (not shown), to receive OR0[t] and OR1[t] instead of only OR[t] and then read from OR0[t] to OR1[t] to OR0[t+1] for "1" to "0" transitions, are readily apparent and performable by one of ordinary skill.

The embodiment described above reads the n+1 location just prior to writing that location so as to compare its contents to DI0[t] and DI1[t] without incurring a timing problem of simultaneous compare and write. An alternative method for avoiding that timing problem is to block all match outputs for the storage locations being written or not yet written to. In other words, when S[n] is being written with DI0[t] and S[n+1] is being written with DI1[t], or when S[n] and S[n+1] have not yet been written, all four match line outputs ML0[n,t], ML1[n,t], ML0[n+1,t], and ML1[n+1,t] would be blocked. This blocking scheme us shown in FIG. 13. It can be seen that this blocking does not require the additional read-before-write circuitry of the previous embodiment, and compression would suffer only slightly. For example, compression would be within 0.2% for a 512 buffer on a large file. The match enabling logic would be a simplified version of FIG. 9, basically the four AND gates and output registers.

The match lines should be enabled (unblocked) according to the following pattern(let n=0 location be written at t=0, count the locations modulus N).

$$\text{MATCH0}[n,t]\ \text{enabled if}\ (2*t) \geq n-1\ \text{AND}\ n=(2*t) \qquad (14)$$

$$\text{MATCH1}[n,t]\ \text{enabled if}\ (2*t) \geq n-1 \qquad (15)$$

$$\text{MATCH0}[n+1,t]\ \text{enabled if}\ (2*t) > n \qquad (16)$$

$$\text{MATCH1}[n+1,t]\ \text{enabled if}\ (2*t) \leq n-1\ \text{AND}\ n=(t+1) \qquad (17)$$

The present invention has been described hereinabove in reference to specific embodiments, selected for demonstrative and explicative purposes. As seen by one of ordinary skill, many alternative embodiments of this described invention are realizable within the scope and meaning of the appended claims. For example, the adaptive dictionary can be replaced by a static dictionary, by replacing the CRAM cells described for the first embodiment with ROM cells, or by merely disabling the write logic. The static dictionary could omit the S[n] match comparison blocking since the entire dictionary may be referenced for compression. Further, the present invention is not limited to two-bytes per cycle but, as can be seen by one of skill, can be enlarged to three or more bytes per cycle by extrapolation from the three-trajectory state equations corresponding to FIG. 9. More particularly, referring to FIG. 10, setting N equal to the number of bytes per cycle, there are $N*(N+1)/2$ trajectories representing a string termination, from one N-byte input cycle to the next. Accordingly, for three bytes per cycle, equations (5), (6) and (7) will expand to six equations and, for ten bytes per cycle, these will expand to ten equations. Similarly, there must be $N*(N+1)/2$ global ORM signals corresponding to the three ORM0[t], ORM1[t] and ORM2[t] of equations (8), (9), and (10). In addition, there will be one M[n,t] expression corresponding to Equation (12 for every two bytes-per-cycle processed. The hardware implementation, although somewhat more complex, can be extrapolated from that described above.

Having thus described my invention, what I claim as new and desire to secure by letters patent is as follows:

1. A string match apparatus comprising:

a memory having N storage locations S[n], n=0 to N−1;

means for receiving an input having a first byte DI0[t] and a second byte DI1[t] in sequence, where t is a time increment;

means for concurrently comparing the first and second byte to a content of each of a plurality of storage locations of said N storage locations, and generating a plurality of first byte match signals ML0[n,t] indicative of a match between the first byte and said content of each of said plurality of storage locations and generating a plurality of second byte match signals ML1[n,t] indicative of a match between the second byte and said content of each of said plurality of storage locations;

means for detecting a string sequential match of the first byte matching the content of a first storage location of said plurality of storage locations and the second byte matching the content of a second storage location from among said plurality of storage locations, based on said first and second byte match signals, and for outputting a match signal indicative of said string sequential match;

means for reading the n+1 library location S[n+1], where n=2*t(MOD[N/2]);

means for comparing said read library location S[n+1] with said first input byte DI0[t] and for generating a first substitute comparison signal MG0[t] representing a result of said comparison;

means for comparing said first and second byte of said input, and for generating a second substitute comparison signal MG1[t] representing said comparison;

means for setting the n+1 of said first byte match signals (ML0[n+1,t])equal to said fist substitute comparison signal MG0[t] for n=2*t(Mod[N/2]); and means for setting the nth of said second byte match signals ML1[n,t] equal to said second substitute comparison signal MG1[t] for n=2*t(Mod[N/2]). wherein said memory comprises:

means for concurrently writing, in one write cycle, said first byte into a first write location of said plurality of storage locations and writing said second byte into a second write location of said plurality of storage locations; and means for sequentially incrementing said first and second write locations so as to write N sequential inputs in an N-length circular buffer manner, within said N storage locations, in N/2 write cycles.

2. A string match apparatus comprising:

a memory having N storage locations S[n], n=0 to N−1;

means for receiving an input having a first byte DI0[t] and a second byte DI1[t] in sequence, where t is a time increment;

means for concurrently comparing the first and second byte to a content of each of a plurality of storage locations of said N storage locations, and generating a plurality of first byte match signals ML0[n,t] indicative of a match between the first byte and said content of each of said plurality of storage locations and generating a plurality of second byte match signals ML1[n,t] indicative of a match between the second byte and said content of each of said plurality of storage locations;

means for detecting a string sequential match of the first byte matching the content of a first storage location of said plurality of storage locations and the second byte matching the content of a second storage location from among said plurality of storage locations, based on said first and second byte match signals, and for outputting a match signal indicative of said string sequential match, said means for detecting a string sequential match comprising:

means for generating a first carry signal PS[n−2,t] representing a match between a second byte of a first sequential input and the contents of a first storage location of said plurality of storage locations;

means for generating a second carry signal PS[n−1,t] representing a match between a second byte of a first sequential input and the contents of a second storage locations of said plurality of storage locations;

means for generating a first intermediate match signal M0[n,t] based on said second carry signal PS[n−1,t] and a first signal ML0[n,t] of said plurality of first match signals, said first signal representing a match between the first byte of a second sequential input and the content of a third storage location of said plurality of storage locations;

means for generating a second intermediate match signal M1[n,1] based on a second signal ML0[n−1,t] of said plurality of first match signals, said second signal representing a match between said first byte of the second sequential input and the content of said second storage location of said plurality of storage locations, and on a first match signal ML1[n,t] of said plurality of second match signals, said first signal representing a match between the second byte of said second sequential input and the content of said third storage location of said plurality of storage locations;

means for generating a third intermediate match signal M2[n,t] based on said second intermediate match signal and said first carry signal PS[n−2,t];

means for selecting between said first, second and third intermediate match signals and outputting said selected signal as said match signal M[n,t], said selection based on the following rules of priority:

equal to said third match signal if said third match signal equal to logical 1, else equal to said first match signal if said first match signal equal to logical 1, else equal to said second match signal; and means for generating a first match occurrence signal OR0[t] and a second match occurrence signal OR1[t], said first match occurrence signal being based on said first intermediate match signal, and said second match occurrence signal being based on said first, second and third intermediate match signals.

3. A string match apparatus according 2 wherein said means for detecting a string sequential match further comprises means for generating a plurality of third carry signals PS[n,t], said means comprising:

means for storing a plurality of third intermediate match signals M2[n,t] corresponding to a first sequential input;

means for storing a plurality of second intermediate match signals M1[n,t] corresponding to a first sequential input;

means for storing a plurality of second byte match signals ML1[n,t] corresponding to a first sequential input; and means for selecting and outputting the plurality of third carry signals, said selection being according to the following rule:

said plurality of third carry signals being said plurality of third intermediate match signals corresponding to a first sequential input if said third condition signal is logical 1, else said plurality of third carry signal being said plurality of second intermediate match signals corresponding to a first sequential input if said first and second condition signal are logical 1, else said plurality of third carry signals being said plurality of second byte match signals corresponding to a first sequential input.

4. A string match apparatus according to claim 2 wherein said means for generating a plurality of first intermediate match signals, said means for generating a plurality of second intermediate match signals, said means for generating a plurality of third intermediate match signals, said means for selecting and outputting a plurality of N match signals, and said means for generating and outputting a plurality of third carry signals jointly include a plurality of match detect cells, each of said cells comprising:

means for generating a select signal having a logical 1 if said first condition signal is logical 0 AND said second condition signal is logical 1;

a first AND gate having a first of said plurality of first byte match signals ML0[n−1,t] and a first of said plurality of second byte match signals ML1[n,t] as inputs, and generating one of said second intermediate match signals M1[n,t] as its output;

a second AND gate having a corresponding one of said plurality of second carry signals PS[n−1,t] and a corresponding one of said plurality of first byte match signals ML0[n,t] as inputs, and generating one of said first intermediate match signals M0[n,t] as its output;

a third AND gate having a corresponding one of said plurality of first carry signals PS[n−2,t] and said second intermediate match signal M1[n,t] as inputs, and generating one of said third intermediate match signals M2[n,t] as its output;

a first 2:1 multiplexer having said one of said second intermediate match signals as its first input and having said one of said second byte match signals as its second input, and having said select signal as its select input, and selecting said first input only if said select signal is logical 1;

a second 2:1 multiplexer having said one of said first intermediate match signals as its first input and having said one of said second intermediate match signals as its second input, and having said first condition signal as its mux select input, and selecting and outputting said first input only if said mux select signal is logical 1;

a third 2:1 multiplexer having said one of said second intermediate match signals as its first input and having the output of said second 2:1 multiplexer as its second input, and having said third condition signal as its mux select input, and selecting and outputting said first input only if said mux select signal is logical 1, said selected output being one of said plurality of match signals;

a fourth 2:1 multiplexer, having said one of said third intermediate match signals as its first input and having the output of said second 2:1 multiplexer as its second input, and having said third condition signal as its mux select input, and selecting and outputting said first input only if said mux select signal is logical 1, said selected output being one of said plurality of third carry signals.

5. A string match apparatus according to claim 4 further comprising means for detecting a write to a read/write memory location and for generating a signal indicative of said write, and wherein said content addressable circuit further comprises means for receiving said signal and forcing said first and second byte match signals to logical 0 in response.

6. A string match apparatus comprising:

a memory having N storage locations S[n], n=0 to N−1;

means for receiving an input having a first byte DI0[t] and a second byte DI1[t] in sequence, where t is a time increment;

means for concurrently comparing the first and second byte to a content of each of a plurality of storage locations of said N storage locations, and generating a plurality of first byte match signals ML0[n,t] indicative of a match between the first byte and said content of each of said plurality of storage locations and generating a plurality of second byte match signals ML1[n,t] indicative of a match between the second byte and said content of each of said plurality of storage locations;

means for detecting a string sequential match of the first byte matching the content of a first storage location of said plurality of storage locations and the second byte matching the content of a second storage location from among said plurality of storage locations, based on said first and second byte match signals, and for outputting a match signal indicative of said string sequential match, said means for detecting a string sequential match comprising:

means for generating a plurality of first carry signals PS[n−2,t], each of said plurality representing a match between a second byte of a first sequential input and a content of a corresponding first storage location of said plurality of storage locations;

means for generating a plurality of second carry signals PS[n−1,t], each of said second plurality representing a match between a second byte of a first sequential input and a content of a corresponding second storage location of said plurality of storage locations;

means for generating a plurality of first intermediate match signals M0[n,t], each of said plurality based on a corresponding one of said second carry signals PS[n−1,t] and a corresponding one of said plurality of first byte match signals, said corresponding first signal representing a match between the first byte of a second sequential input and a content of a corresponding third storage location of said plurality of storage locations;

means for generating a plurality of second intermediate match signals, each of said plurality based on a corresponding second signal ML0[n−1,t] of said plurality of first byte match signals, said corresponding second signal representing a match between said first byte of the second sequential input and the content of said corresponding second storage location of said plurality of storage locations, and on a corresponding first signal ML1[n,t] of said plurality of second byte match signals, said corresponding first signal representing a match between the second byte of said second sequential input and the content of said corresponding third storage location of said plurality of storage locations;

means for generating a plurality of third intermediate match signals, each of said plurality based on a corresponding one of said second intermediate match signals and a corresponding one of said first carry signals PS[n−2,t];

means for detecting if any from among said plurality of first match signals is equal to logical 1 and for generating a first condition signal having logical 1 representing said detection;

means for detecting if any from among said plurality of second match signals is equal to logical 1 and for generating a second condition signal having logical 1 representing said detection;

means for detecting if any from among said plurality of third match signals is equal to logical 1 and for generating a third condition signal having logical 1 representing said detection;

means for selecting and outputting a plurality of N match signals, each of said match signals being selected from a corresponding first, second and third intermediate match signal, said selection based on the following rules of priority:
equal said corresponding third match signal if said third condition signal is equal to logical 1, else
equal said corresponding first match signal if said first condition signal is equal to logical 0, else
equal said second match signal; and means for generating a first match occurrence signal OR0[t] and a second match occurrence signal OR1[t], said first match occurrence signal being based on said first condition signal, and said second match occurrence signal being based on said first, second and third condition signals.

7. A method for string matching, comprising the steps of:

(a) initializing index variable t to t=0;

(b) receiving an even input DI0[t];

(c) receiving an odd input DI1[t];

(d) simultaneously comparing the even-odd input bytes DI0[t] and DI1[t] to the contents of each of N library locations S[n], n=0 to N−1;

(e) simultaneously writing DI0[t] to library location S[n] and DI1[t] to library location S[n+1];

(f) generating N comparison output pairs ML0[n,t] and ML1[n,t], where ML0[n,t]=logical 1 if DI0[t]=content of S[n] and ML1[n,t]=1 if DI1=content of S[n], for n=0 to N−1;

(g) generating ML0[n,t]=0, ML1[n,t]=0 for n=2* t(Mod [N/2]) and for n>t/2;

(h) generating PS[n,t]=0 for n=0 to N−1, if t=0;

(i) generating M0[n,t]=PS[n−1,t] AND ML0[n,t] for n=0 to N−1;

(j) generating M1[n,t]=ML0[n−1,t] AND ML1[n,t] for n=0 to N−1;

(k) generating M2[n,t]=PS [n−2,t] AND ML0[n−1,t] AND ML1[n,t] for n=0 to N−1;

(l) generating ORM0[t]=M0[n,t] OR M0[1,t]. . . OR M0,N−1,t];

(m) generating ORM1[t]=M1[n,t] OR M1[1,t]. . . OR M1,N−1,t];

(n) generating ORM2[t]=M2[n,t] OR M2[1,t]. . . OR M2,N−1,t];

(o) generating $PS[n, t]$, for $n = 0$ to $N - 1$,
= 0 if $t = 0$ else
= $M2[n, t - 1]$ if $ORM2[t] = 1$ else
= $M1[n, t - 1]$ if $(ORM1[t]$ AND (NOT $ORM0[t])) = 1$ else
= $ML1[n, t - 1]$ otherwise;

(p) generating $M[n, t]$, for $n = 0$ to $N - 1$,
= 0 if $t = 0$, else
= $M2[n, t - 1]$ if $ORM2[t - 1] = 1$ else
= $M0[n, t - 1]$ else if $ORM0[t - 1] = 1$ else
= $M1[n, t - 1]$ otherwise;

(q) detecting matches of consecutive input DI0[t] and DI1[t] with a content of consecutive locations S[n], based on ORM0[t], ORM1[t] and ORM2[t], and outputting a signal representing said detection;

(r) incrementing t to t=t+1; and (s) repeating steps (b) through (r) until said input DI0[T] and DI1[t] terminates.

8. A method according to claim 7 comprising the further steps of:

after step (c) performing the steps of:

(c1) reading library location S[n+1], where n=2*t (MOD[N/2])+1;

(c2) generating MG0[t]=1 if S[n+1]=DI0[t], else =0;

(c3) generating MG1[t]=1 if DI0[t]=DI1[t], else =0; and after step (g) performing the steps of:

(g1) generating ML0[n+1,t]=MG0[t] for n=2*t(Mod [N/2]);

(g2) generating ML1[n,t]=MG1[t] for n=2*t(Mod[N/2]).

* * * * *